(12) United States Patent
Kobayakawa

(10) Patent No.: US 9,059,387 B2
(45) Date of Patent: *Jun. 16, 2015

(54) SEMICONDUCTOR LIGHT-EMITTING DEVICE

(71) Applicant: ROHM CO., LTD., Kyoto-shi, Kyoto (JP)

(72) Inventor: Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/574,640

(22) Filed: Dec. 18, 2014

(65) Prior Publication Data

US 2015/0091040 A1  Apr. 2, 2015

Related U.S. Application Data

(60) Continuation of application No. 14/184,173, filed on Feb. 19, 2014, now Pat. No. 8,946,763, which is a continuation of application No. 14/021,501, filed on Sep. 9, 2013, now Pat. No. 8,680,568, which is a continuation of application No. 13/414,294, filed on Mar. 7, 2012, now Pat. No. 8,541,808, which is a continuation of application No. 12/890,964, filed on Sep. 27, 2010, now Pat. No. 8,154,045, which is a division of application No. 12/079,760, filed on Mar. 28, 2008, now Pat. No. 7,825,426.

(30) Foreign Application Priority Data

Mar. 30, 2007  (JP) .................................. 2007-092879

(51) Int. Cl.
*H01L 33/00* (2010.01)
*H01L 33/62* (2010.01)
*H01L 33/56* (2010.01)
*H01L 33/54* (2010.01)
*H01L 33/60* (2010.01)

(52) U.S. Cl.
CPC ................. *H01L 33/62* (2013.01); *H01L 33/56* (2013.01); *H01L 33/54* (2013.01); *H01L 33/60* (2013.01)

(58) Field of Classification Search
CPC ........................................................ H01L 33/62
USPC ...................... 257/99, 690, 692, 735, E33.058
See application file for complete search history.

(56) References Cited

U.S. PATENT DOCUMENTS 5,062,115 A   10/1991  Thornton
5,719,663 A   2/1998   Hirai et al.

(Continued)

FOREIGN PATENT DOCUMENTS

CN   1288261   3/2001
CN   1822402   8/2006

(Continued)

*Primary Examiner* — Dale E Page
(74) *Attorney, Agent, or Firm* — Hamre, Schumann, Mueller & Larson, P.C.

(57) ABSTRACT

A semiconductor light-emitting device includes a lead frame, a semiconductor light-emitting element mounted on the top surface of the bonding region, and a case covering part of the lead frame. The bottom surface of the bonding region is exposed to the outside of the case. The lead frame includes a thin extension extending from the bonding region and having a top surface which is flush with the top surface of the bonding region. The thin extension has a bottom surface which is offset from the bottom surface of the bonding region toward the top surface of the bonding region.

20 Claims, 3 Drawing Sheets

(56) References Cited

U.S. PATENT DOCUMENTS

| | | |
|---|---|---|
| 6,501,156 B1 | 12/2002 | Nakanishi et al. |
| 7,436,002 B2 | 10/2008 | Brunner et al. |
| 7,655,958 B2 | 2/2010 | Sanmyo |
| 8,680,568 B2 | 3/2014 | Kobayakawa |
| 2004/0159850 A1 | 8/2004 | Takenaka |
| 2005/0269587 A1 | 12/2005 | Loh et al. |
| 2005/0280017 A1 | 12/2005 | Oshio et al. |
| 2006/0170083 A1 | 8/2006 | Kim et al. |
| 2008/0121921 A1 | 5/2008 | Loh et al. |

FOREIGN PATENT DOCUMENTS

| | | |
|---|---|---|
| JP | 2000-244022 | 9/2000 |
| JP | 2004-274027 | 9/2004 |
| JP | 2005-353914 | 12/2005 |
| JP | 3125666 | 9/2006 |
| JP | 20007-5378 | 1/2007 |
| JP | 2007-59677 | 3/2007 |
| JP | 2007-67443 | 3/2007 |
| WO | WO 03/005458 | 1/2003 |

SEMICONDUCTOR LIGHT-EMITTING DEVICE

This application is a Continuation of application Ser. No. 14/184,173, filed Feb. 19, 2014, which is a Continuation of application Ser. No. 14/021,501, filed Sep. 9, 2013, which is a Continuation of application Ser. No. 13/414,294, filed Mar. 7, 2012, which is a Continuation of application Ser. No. 12/890,964, filed Sep. 27, 2010, which is a Division of application Ser. No. 12/079,760, filed Mar. 28, 2008, which applications are incorporated herein by reference.

BACKGROUND OF THE INVENTION

1. Field of the Invention

The present invention relates to a semiconductor light-emitting device provided with a semiconductor light-emitting element.

2. Description of the Related Art

FIGS. 6 and 7 illustrate an example of conventional semiconductor light-emitting device (see JP-A-2005-353914, for example). The illustrated semiconductor light-emitting device X includes a lead frame 91, an LED chip 92, a case 93, and a transparent resin 94. The lead frame 91 includes two strip portions, i.e., a relatively long portion 91a and a relatively short portion 91b, as seen from FIG. 6. These two portions, having the same width as seen from FIG. 7, are fitted into a lower space in the case 93 in a manner such that the bottom surface of the lead frame 91 is exposed out of the case 93. The LED chip 92 serves as a light source of the semiconductor light-emitting device X, and is bonded to the longer strip portion 91a of the lead frame 91. The LED chip 92 is connected to the shorter strip portion 91b of the lead frame 91 via a wire 95. The light-emitting device X may be mounted on a printed circuit board, for example.

In order to obtain stronger light emission from the semiconductor light-emitting device X, it is required to apply greater electrical power to the LED chip 92. Inevitably, the amount of heat generated by the LED chip 92 is increased, and for maintaining the proper light emission, the heat should be conducted from the longer strip portion 91a to the circuit board. One way to facilitate the heat conduction is to broaden the strip portion 91a (hence the lead frame 91) to which the LED chip 92 is attached.

While the width of the longer strip portion 91a is to be increased, the overall size of the case 93 may be unchanged so that the light-emitting device X is kept compact. In this case, the side walls of the case 93 need to be made thinner to permit the size increase of the longer strip portion 91a. This configuration, however, will weaken the frame-holding force of the case 93, which may allow the lead frame 91 to drop off from the case 93.

SUMMARY OF THE INVENTION

The present invention has been proposed under above-described circumstances, and thus an object of the present invention is to provide a semiconductor light-emitting device that is compact and capable of emitting bright light.

According to the present invention, there is provided a semiconductor light-emitting device comprising: a lead frame including a bonding region having a top surface and a bottom surface; a semiconductor light-emitting element mounted on the top surface of the bonding region; and a case covering part of the lead frame. The bottom surface of the bonding region is exposed to an outside of the case. The lead frame includes a thin extension extending from the bonding region and having a top surface and a bottom surface. The top surface of the thin extension is flush with the top surface of the bonding region, while the bottom surface of the thin extension is offset from the bottom surface of the bonding region toward the top surface of the bonding region.

Preferably, the semiconductor light-emitting device of the present invention may further comprise a thick extension extending from the bonding region and having a top surface and a bottom surface. The thick extension is arranged adjacent to the thin extension and is the same in thickness as the bonding region. The bottom surface of the thick extension is exposed to the outside of the case.

Other features and advantages will be apparent from the following description with reference to the accompanying drawings.

DETAILED DESCRIPTION OF THE PREFERRED EMBODIMENTS

Preferred embodiments of the present invention will be described below with reference to the accompanying drawings.

Figure 1:
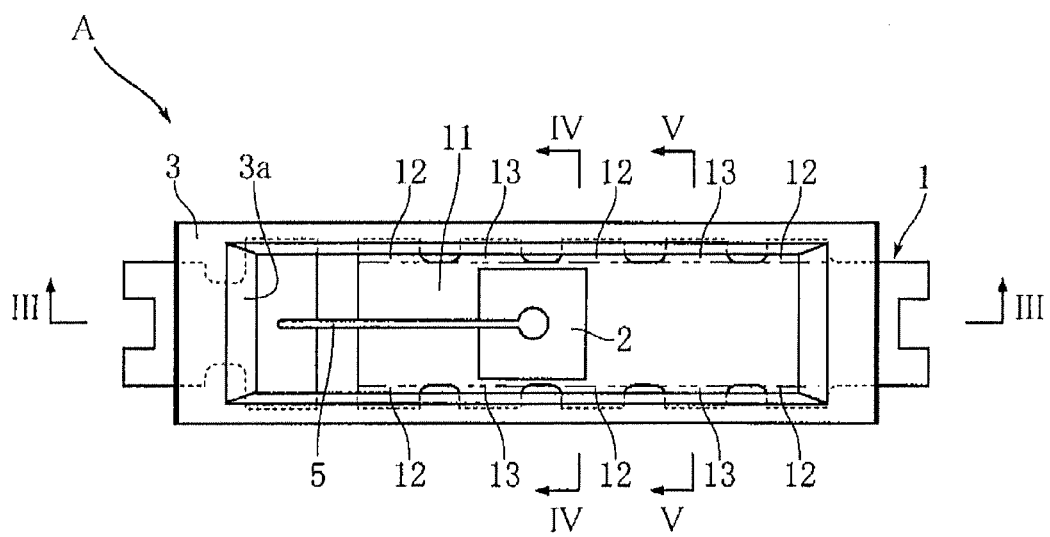
FIG. 1 is a plan view illustrating the principal portions of a semiconductor light-emitting device according to the present invention.

FIGS. 1-5 illustrate a semiconductor light-emitting device according to the present invention. The semiconductor light-emitting device A includes a lead frame 1, a light-emitting diode (LED) chip 2, a case 3, and a protection resin 4 that allows the passage of light emitted from the LED chip 2. The light-emitting device A is a small rectangular parallelepiped having a length of about 4 mm, a width of about 1 mm, and a height of about 0.6 mm. In FIG. 1, for convenience of explanation, the protection resin 4 is not shown.

Figure 2:
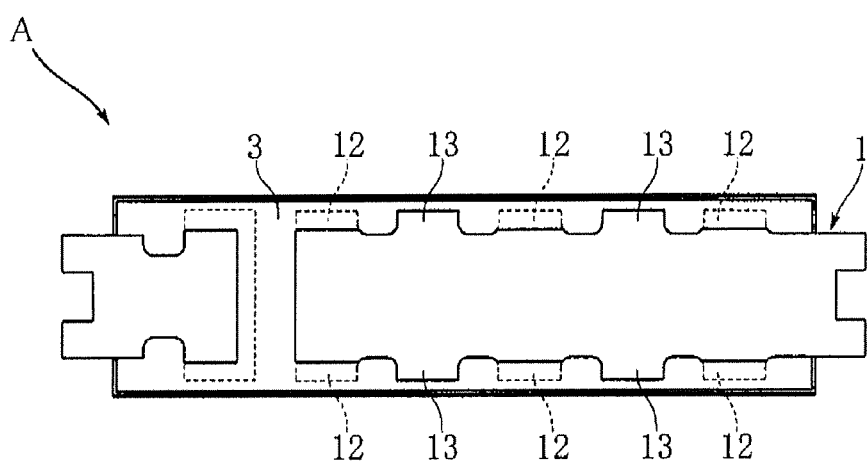
FIG. 2 is a bottom view illustrating the semiconductor light-emitting device shown in FIG. 1.

The lead frame 1 is made of Cu, Ni, or an alloy containing Cu and/or Ni. As shown in FIG. 2, the lead frame 1 is exposed out of the case 3 at its bottom surface, and is divided into a longer primary portion and a shorter secondary portion. The primary portion includes a bonding region 11, a plurality of thin extensions 12, and a plurality of thick extensions 13. In FIG. 1, the boundary between the bonding region 11 and the extensions 12, 13 is indicated by double-dot broken lines.

Figure 4:
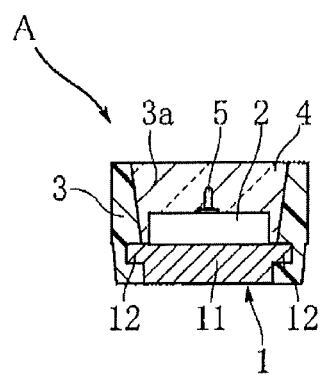
FIG. 4 is a sectional view taken along lines IV-IV in FIG. 1.

The bonding region 11 is a strip-shaped region on part of which the LED chip 2 is mounted. Each of the thin extensions 12 extends out from the bonding region 11, and has a thickness which is about half the thickness of the bonding region 11, for example. As shown in FIG. 4, the top surfaces of the thin extensions 12 are flush with the top surface of the bonding region 11. The bottom surfaces of the thin extensions 12 are positioned higher than the bottom surface of the bonding potion 11, as viewed vertically in FIG. 4 (in other words, the bottom surfaces of the thin extensions 12 are offset toward the top surface of the bonding region 11 from the bottom surface of the bonding region 11). The bottom surfaces of the thin extensions 12 are covered by the case 3.

Figure 5:
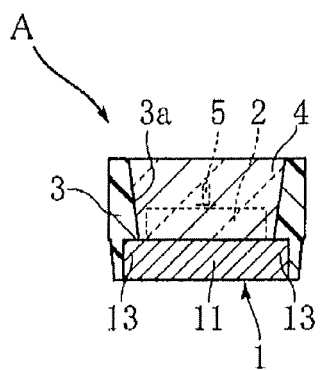
FIG. 5 is a sectional view taken along lines V-V in FIG. 1.
Figure 6:
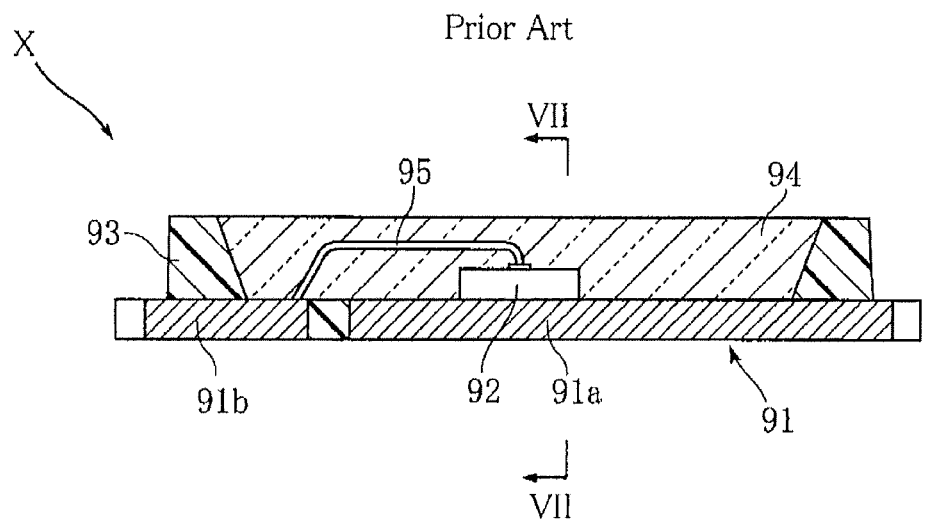
FIG. 6 is a sectional view illustrating a conventional semiconductor light-emitting device.
Figure 7:
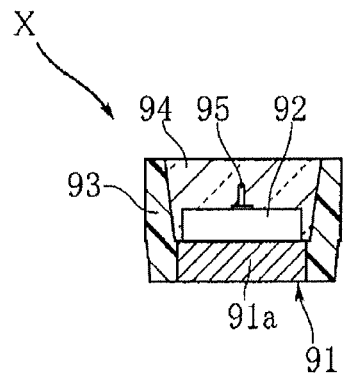
FIG. 7 is a sectional view taken along lines VII-VII in FIG. 6.

As shown in FIG. 5, each of the thick extensions 13 extends out from the bonding region 11, and has a thickness which is substantially the same as the thickness of the bonding region 11. The top surfaces of the thick extensions 13 are flush with the top surface of the bonding region 11, and the bottom surfaces of the thick extensions 13 (which are flush with the bottom surface of the bonding region 11) are exposed to the outside of the case 3. As shown in FIGS. 1 and 2, the thin extensions 12 and the thick extensions 13 are arranged alternatively in the longitudinal direction of the lead frame 1.

The LED chip 2 as a light source of the light-emitting device A is configured to emit light of a predetermined wavelength. The LED chip 2 is made of a semiconductor material such as GaN, for example, and emits blue light, green light, or red light by the recombination of electrons and holes at an active layer sandwiched by an n-type semiconductor layer and a p-type semiconductor layer. The LED chip 2 is connected to the shorter portion of the lead frame 1 via a wire 5.

Figure 3:
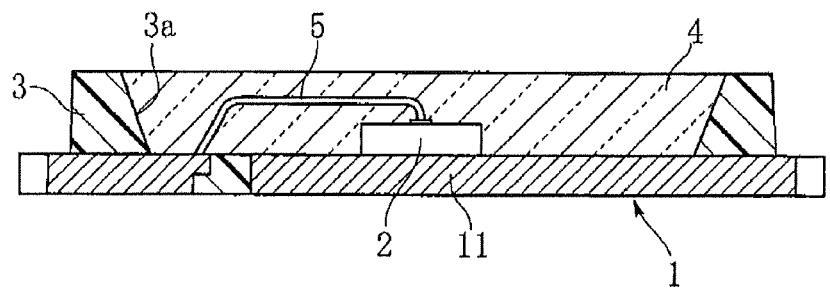
FIG. 3 is a sectional view taken along lines III-III in FIG. 1.

The case 3 is made of a white resin, for example, and is a generally rectangular frame. As shown in FIGS. 3-5, the inner surfaces of the case 3 serve as a reflector 3a that tapers downward. The reflector 3a upwardly reflects light which is emitted laterally from the LED chip 2. As shown in FIG. 4, the case 3 is held in unreleasable engagement with the thin extensions 12. Further, as shown in FIG. 2, the case 3 is in mesh with the thin extensions 12 and the thick extensions 13.

The protection resin 4 is made of a transparent or transparent epoxy resin, for example, filled in a space defined by the case 3. The protection resin 4 covers the LED chip 2, and while protecting the LED chip 2.

Next, the functions of the semiconductor light device A will be described below.

As described above, the case 3 is held in unreleasable engagement with the thin extensions 12. Thus, the lead frame 1 is reliably held by the case 3, to be prevented from dropping off from the case 3. As a result, though the light-emitting device A has a very small width (about 1 mm), the lead frame 1 is exposed out of the case 3 in a relatively large area, as seen from FIG. 2. Therefore, heat can be efficiently conducted from the LED chip 2 to a printed circuit board, for example, which contributes to attaining light emission of desired intensity.

As described above, the thin extensions 12 and the thick extensions 13 are arranged to alternate with each other, and the bottom surfaces of the thick extensions 13 are exposed to the outside of the case 3, as shown in FIG. 2. In this manner, the exposed area of the lead frame 1 can be increased. Advantageously, this facilitates the heat dissipation from the led chip 2.

The invention claimed is:

1. A semiconductor light-emitting device comprising:
a first lead frame;
a second lead frame spaced apart from the first lead frame in a first direction;
a semiconductor light-emitting element bonded to the first lead frame and electrically connected to the second lead frame; and
a case covering a part of each of the first lead frame and the second lead frame and made of a white resin capable of reflecting light of the semiconductor light-emitting element;
wherein the first lead frame and the second lead frame include a first terminal portion and a second terminal portion, respectively, both of the first terminal portion and the second terminal portion protruding from the case in a plan view,
the case has a rectangular form in a plan view, having an edge extending in the first direction and an edge extending in a second direction perpendicular to the first direction, the case including a frame portion that surrounds the semiconductor light-emitting element and has an inner wall surface constituting a reflector for reflecting the light of the semiconductor light-emitting element in a light-emitting direction,
the light-emitting element, a part of the first lead frame and a part of the second lead frame are exposed from the case through an opening defined by the reflector,
a transparent resin is filled in the opening to cover the semiconductor light-emitting element, the transparent resin allowing the light of the semiconductor light-emitting element to pass therethrough,
the first lead frame comprises a bonding portion having: an obverse surface located in the opening in a plan view and to which the semiconductor light-emitting element is bonded; and a first reverse surface opposite to the obverse surface and exposed from the case; the first lead frame further comprising a first extension formed integral with the bonding portion and extending from the bonding portion to a region overlapping the frame portion in a plan view, the first extension having: an upper surface oriented to face in a third direction perpendicular to both the first direction and the second direction in a same manner as the obverse surface; and a first covered surface oriented to face in the third direction in a same manner as the first reverse surface of the first lead frame;
the first covered surface of the first extension is parallel to the first reverse surface of the bonding portion and offset toward the light-emitting direction in the third direction relative to the first reverse surface of the bonding portion,
the case covers, at the frame portion, the upper surface of the first extension in close contact therewith, and also includes a first holding portion covering the first covered surface of the first extension in close contact therewith,
the first terminal portion, the second terminal portion and the bonding portion have a same thickness, and the first terminal portion, the second terminal portion, the bonding portion and the first holding portion are flush with each other, and
the first lead frame as a whole is not greater in thickness than the first terminal portion.

2. The semiconductor light-emitting device according to claim 1, wherein the second lead frame as a whole is not greater in thickness than the second terminal portion.

3. The semiconductor light-emitting device according to claim 1, wherein the first terminal portion and the second terminal portion protrude from the case in the first direction.

4. The semiconductor light-emitting device according to claim 3, wherein the first terminal portion and the second terminal portion protrude outward in the first direction from an edge of the case extending in the second direction.

5. The semiconductor light-emitting device according to claim 1, wherein the second lead frame has a second covered surface oriented to face in the third direction in the same manner as the first covered surface of the first extension of the first lead frame, the second covered surface being parallel to the first covered surface, the second lead frame also having a second reverse surface arranged side by side with the second covered surface in a plan view,
the second reverse surface is exposed from the case,
the second covered surface is offset toward the light-emitting direction in the third direction relative to the second reverse surface, the case includes a second bolding portion covering the second covered surface in close contact therewith, and the second reverse surface and the second holding portion are flush with the first terminal portion, the second terminal portion, the bonding portion and the first holding portion.

6. The semiconductor light-emitting device according to claim 5, wherein the second covered surface is in contact with an edge close to the first lead frame in the first direction, and the second reverse surface is spaced from the first lead frame in the first direction more than the second covered surface.

7. The semiconductor light-emitting device according to claim 1, wherein the extension of the first lead frame extends from the bonding portion in the second direction.

8. The semiconductor light-emitting device according to claim 1, wherein the opening of the case is rectangular.

9. The semiconductor light-emitting device according to claim 1, wherein the first lead frame and the second lead frame, except at the first terminal portion, the second terminal portion and the bonding portion, are not greater in thickness than the bonding portion.

10. The semiconductor light-emitting device according to claim 1, wherein respective surfaces of the first terminal portion, the second terminal portion, the bonding portion and the extension on a light-emitting direction side are at a same position relative to the third direction.

11. A semiconductor light-emitting device comprising:
a first lead frame;
a second lead frame spaced apart from the first lead frame in a first direction;
a semiconductor light-emitting element bonded to the first lead frame and electrically connected to the second lead frame; and
a case covering a part of each of the first lead frame and the second lead frame;
wherein the first lead frame and the second lead frame include a first terminal portion and a second terminal portion, respectively, both of the first terminal portion and the second terminal portion protruding from the case in a plan view,
the case comprises a frame portion surrounding the semiconductor light-emitting element in the first direction and a second direction perpendicular to the first direction, the frame portion having an inner wall surface constituting a reflector for reflecting light of the semiconductor light-emitting element in a light-emitting direction,
the light-emitting element, a part of the first lead frame and a part of the second lead frame are exposed from the case through an opening defined by the reflector,
a transparent resin is filled in the opening to cover the semiconductor light-emitting element, the transparent resin allowing the light of the semiconductor light-emitting element to pass therethrough,
the first lead frame comprises a bonding portion having: an obverse surface located in the opening in a plan view and to which the semiconductor light-emitting element is bonded; and a first reverse surface opposite to the obverse surface and exposed from the case; and the first lead frame also comprises a first extension formed integral with the bonding portion and extending from the bonding portion to a region overlapping the frame portion in a plan view, the first extension having; an upper surface oriented to face in a third direction perpendicular to both the first direction and the second direction in a same manner as the obverse surface; and a first covered surface oriented to face in the third direction in a same manner as the first reverse surface of the first lead frame;

the first covered surface of the first extension is offset toward the light-emitting direction in the third direction relative to the first reverse surface of the bonding portion, the case covers, at the frame portion, the upper surface of the first extension in close contact therewith and also includes a first holding portion that covers the first covered surface of the first extension in dose contact therewith, the first terminal portion, the second terminal portion and the bonding portion are the same in thickness and the first terminal portion, the second terminal portion, the bonding portion and the first holding portion are flush with each other, and the first lead flame as a whole is not greater in thickness than the first terminal portion.

12. The semiconductor light-emitting device according to claim 11, wherein the second lead frame as a whole is not greater in thickness than the second terminal portion.

13. The semiconductor light-emitting device according to claim 11, wherein the first terminal portion and the second terminal portion protrude from the case in the first direction.

14. The semiconductor light-emitting device according to claim 13, wherein the case has a rectangular form including an edge extending in the first direction and another edge extending in the second direction, and the first terminal portion and the second terminal portion protrude outward in the first direction from an edge of the case extending in the second direction.

15. The semiconductor light-emitting device according to claim 11, wherein the second lead frame includes a second covered surface oriented to face in the third direction in the same manner as the first covered surface of the first extension of the first lead frame, and also includes a second reverse surface arranged side by side with the second covered surface in a plan view, the second reverse surface is exposed from the case, the second covered surface is offset toward the light-emitting direction in the third direction relative to the second reverse surface, the case includes a second holding portion covering the second covered surface in close contact therewith, and the second reverse surface and the second holding portion are flush with the first terminal portion, the second terminal portion, the bonding portion and the first holding, portion.

16. The semiconductor light-emitting device according to claim 15, wherein the second covered surface is in contact with an edge close to the first lead frame in the first direction, the second reverse surface is spaced from the first lead frame in the first direction than the second covered surface.

17. The semiconductor light-emitting device according: to claim 11, wherein the extension of the first lead frame extends front the bonding portion in the second direction.

18. The semiconductor light-emitting device according to claim 11, wherein the opening of the case is rectangular.

19. The semiconductor light-emitting device according to claim 11, wherein respective surfaces of the first terminal portion, the second terminal portion, the bonding portion and the extension on a light-emitting direction side are at a same position relative to the third direction.

20. The semiconductor light-emitting device according to claim 11, wherein the case is made of a white resin capable of reflecting the light of the semiconductor light-emitting element.

* * * * *